United States Patent
Jansen

(10) Patent No.: US 12,414,383 B2
(45) Date of Patent: Sep. 9, 2025

(54) THIN FILM PHOTO-VOLTAIC MODULE

(71) Applicant: Nederlandse Organisatie voor toegepast-natuurwetenschappelijk Onderzoek TNO, s-Gravenhage (NL)

(72) Inventor: Markus Johan Jansen, s-Gravenhage (NL)

(73) Assignee: Nederlandse Organisatie voor toegepast-natuurwetenschappelijk Onderzoek TNO, 's-Gravenhage (NL)

( * ) Notice: Subject to any disclaimer, the term of this patent is extended or adjusted under 35 U.S.C. 154(b) by 541 days.

(21) Appl. No.: 16/336,477

(22) PCT Filed: Sep. 25, 2017

(86) PCT No.: PCT/NL2017/050637
§ 371 (c)(1),
(2) Date: Mar. 26, 2019

(87) PCT Pub. No.: WO2018/056823
PCT Pub. Date: Mar. 29, 2018

(65) Prior Publication Data
US 2021/0288198 A1    Sep. 16, 2021

(30) Foreign Application Priority Data

Sep. 26, 2016  (NL) ..................................... 2017527

(51) Int. Cl.
*H10F 19/35*   (2025.01)
*H10F 77/20*   (2025.01)

(52) U.S. Cl.
CPC ........... *H10F 19/35* (2025.01); *H10F 77/223* (2025.01); *H10F 77/244* (2025.01)

(58) Field of Classification Search
None
See application file for complete search history.

(56) References Cited

U.S. PATENT DOCUMENTS 9,647,158 B2    5/2017  van Hest et al.
2008/0216887 A1*  9/2008  Hacke ................. H01L 31/0516
                                                    257/E31.11
(Continued)

FOREIGN PATENT DOCUMENTS

CN    101510570 A    8/2009
CN    104282802 A    1/2015
(Continued)

*Primary Examiner* — Tamir Ayad
(74) *Attorney, Agent, or Firm* — Ipsilon USA—NLO

(57) ABSTRACT

Photovoltaic module with a plurality of thin film photovoltaic cells (2). Each thin film photovoltaic cell (2) has a transparent electrode (12) provided on a transparent substrate (11), a solar cell stack (13) positioned on the transparent electrode (12), and a top electrode (14) positioned on the solar cell stack (13). A plurality of parallel connected PV cell units (3) are provided, each comprising a string of series connected PV cells (2). A positive connection part (6, 20a) and a negative connection part (5, 20b) are present in a single top interconnection layer, providing the parallel connection circuit of the parallel connected PV cell units (3). At least one cross over connection member (9a, 9b) is present in a layer different from the single top interconnection layer, which provides an electrical connection in the negative connection part (5, 20b) and/or in the positive connection part (6, 20a).

3 Claims, 11 Drawing Sheets

(56) References Cited

U.S. PATENT DOCUMENTS

| | | | |
|---|---|---|---|
| 2011/0120531 A1* | 5/2011 | Nese | H01L 31/0516 |
| | | | 136/251 |
| 2011/0146749 A1 | 6/2011 | Nasuno | |
| 2011/0162689 A1* | 7/2011 | Ueda | H02S 20/23 |
| | | | 136/244 |
| 2012/0160297 A1* | 6/2012 | Yamakawa | H01L 31/02021 |
| | | | 136/244 |
| 2013/0098422 A1 | 4/2013 | Chan et al. | |
| 2013/0133714 A1 | 5/2013 | Berens | |
| 2013/0312808 A1 | 11/2013 | Bauer et al. | |
| 2015/0311371 A1* | 10/2015 | Krishnamoorthy | ............................ |
| | | | H01L 31/0201 |
| | | | 136/256 |
| 2016/0155873 A1 | 6/2016 | Aspnes et al. | |

FOREIGN PATENT DOCUMENTS

| | | |
|---|---|---|
| EP | 2378562 A | 10/2011 |
| JP | S6138957 U | 3/1986 |
| JP | 63-136360 S | 9/1988 |
| JP | 2001111083 A2 | 4/2001 |
| RU | 2541698 C2 | 2/2015 |
| TW | 201123482 A | 7/2011 |
| WO | 2014188092 A | 11/2014 |
| WO | 2015150514 A | 10/2015 |

\* cited by examiner

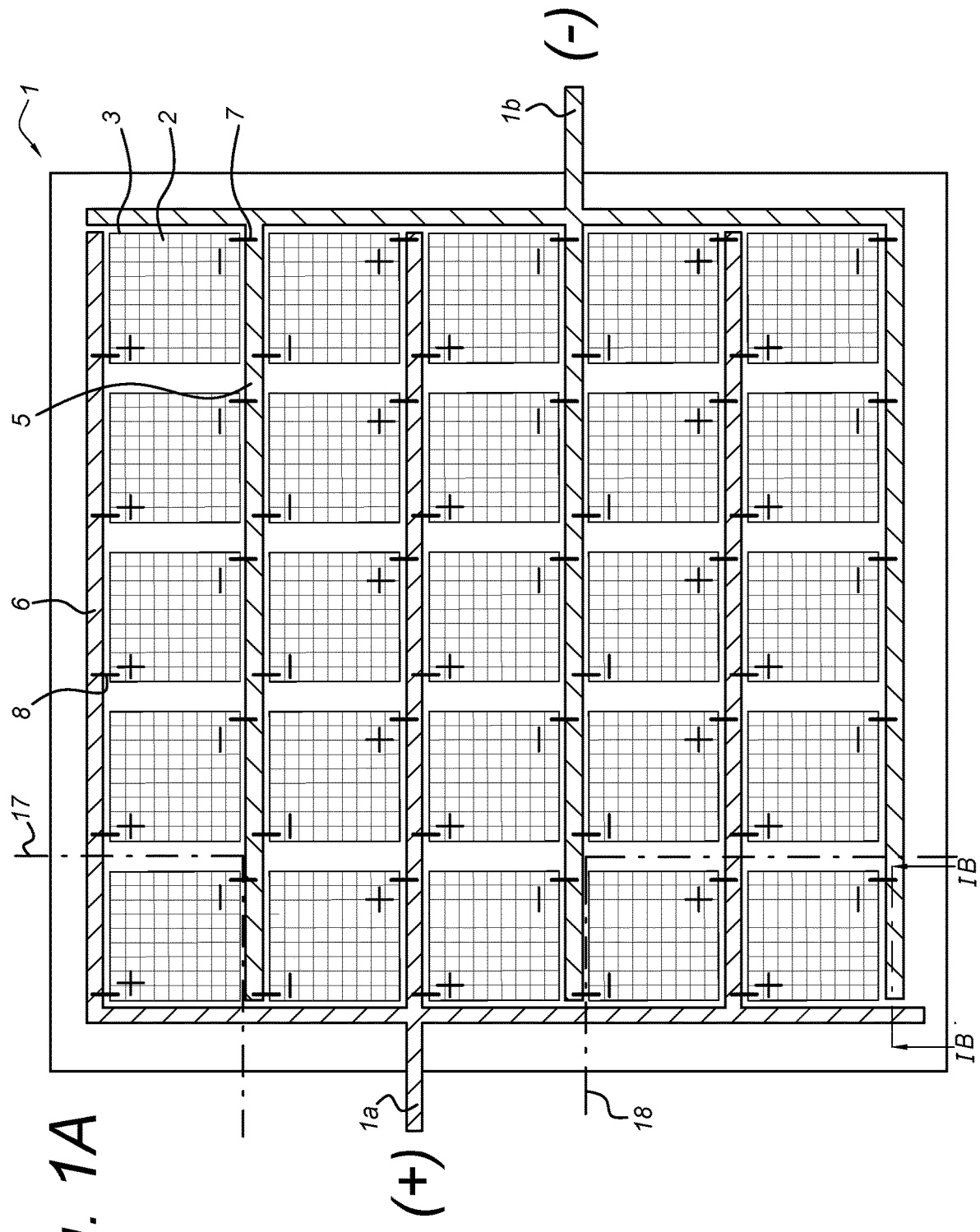

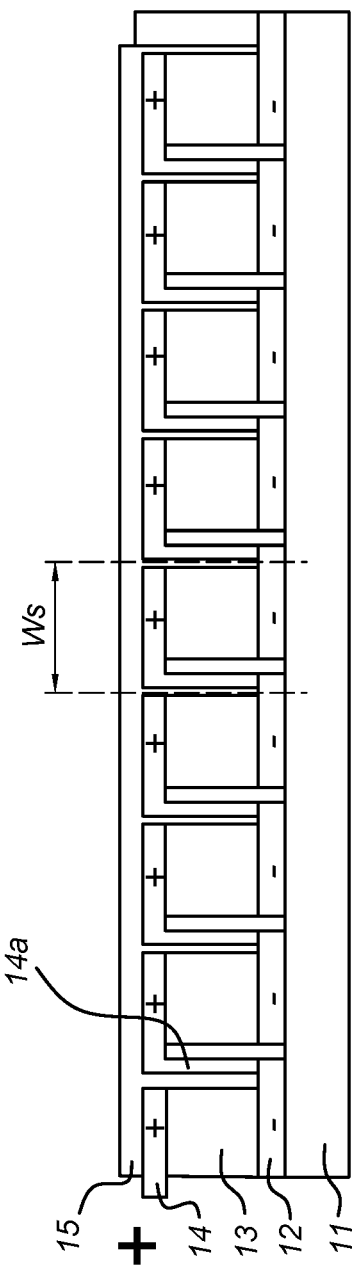
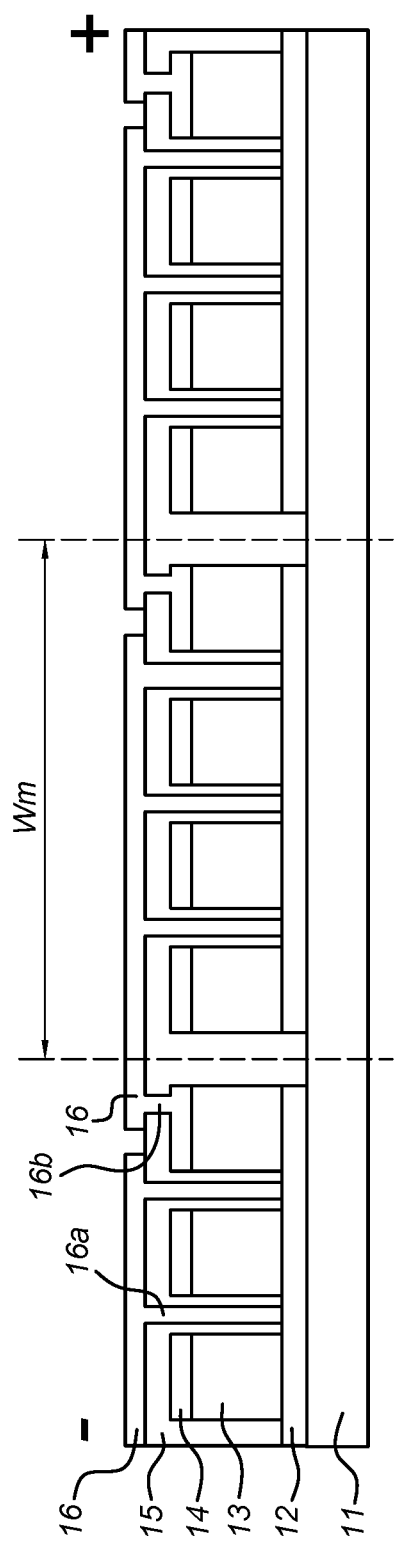
Fig. 1B
Fig. 1C

THIN FILM PHOTO-VOLTAIC MODULE

FIELD OF THE INVENTION

The present invention relates to a photovoltaic module comprising a plurality of thin film photovoltaic (PV) cells positioned on a transparent substrate, each thin film photovoltaic (PV) cell comprising a transparent electrode provided on the transparent substrate, a solar cell stack positioned on the transparent electrode, and a top electrode positioned on the solar cell stack.

BACKGROUND ART

International patent publication WO2014/188092 discloses a thin film semi-transparent photovoltaic mono-cell having a plurality of active photovoltaic zones separated by transparent zones. The photovoltaic zones are formed from a stack of thin films arranged on a transparent substrate, the stack having a transparent electrode, an absorber layer and a metal electrode.

European patent publication discloses a thin-film solar cell module which has a substrate and a cell module having three or more cell strings with a constant width. Each cell string has a plurality of solar cells connected in series and are provided on the substrate in parallel connection. The solar cells have a front surface electrode, a photoelectric conversion layer and a rear surface electrode. Further, each cell string has contact lines electrically connecting the front surface electrode of a first solar cell to the rear surface electrode of a second solar cell.

SUMMARY OF THE INVENTION

The present invention seeks to provide a solution to provide a thin film photovoltaic module with a high degree of flexibility in shape, design and use of the photovoltaic module.

According to the present invention, a photovoltaic module as defined above is provided, wherein a plurality of parallel connected photovoltaic cell units are provided, each comprising a string of series connected photovoltaic cells, the photovoltaic module further comprising a positive connection part and a negative connection part in a single top interconnection layer, providing the parallel connection circuit of the parallel connected photovoltaic cell units, and at least one cross over connection member in a layer different from the single top interconnection layer, the at least one cross over connection member providing an electrical connection in the negative connection part and/or in the positive connection part.

With the present invention embodiments, it is possible to design or cut the photovoltaic module (further below also indicated as PV module) into any size without changing the basic specification of the PV module. The PV cell units of a PV module are in a parallel circuit configuration, thus, a fixed PV module voltage is provided even if one or more of the PV cell units are removed (or left out during the manufacturing process). The current provided is then linearly dependent on the PV module area. This also holds in case a 'full' PV module is in operation, and part of the PV module is shaded.

SHORT DESCRIPTION OF DRAWINGS

The present invention will be discussed in more detail below, with reference to the attached drawings, in which FIG. 1A shows a schematic view of a PV module according to an exemplary prior art implementation, and FIGS. 1B and 1C show cross sectional views of two types of thin film PV cells;

Figure 3:
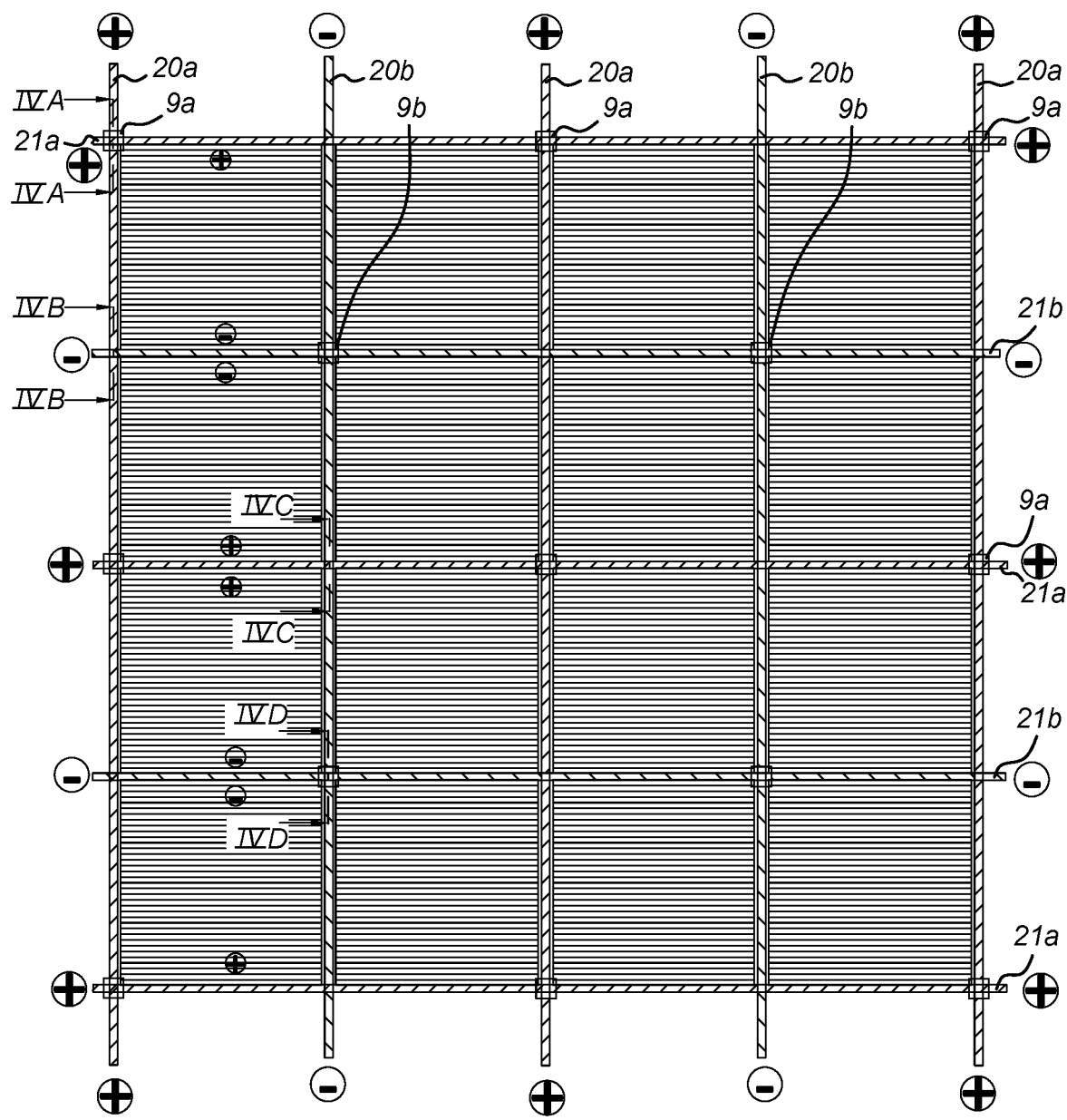
FIG. 3 shows a schematic view of a PV module according to a second embodiment of the present invention.
Figure 5:
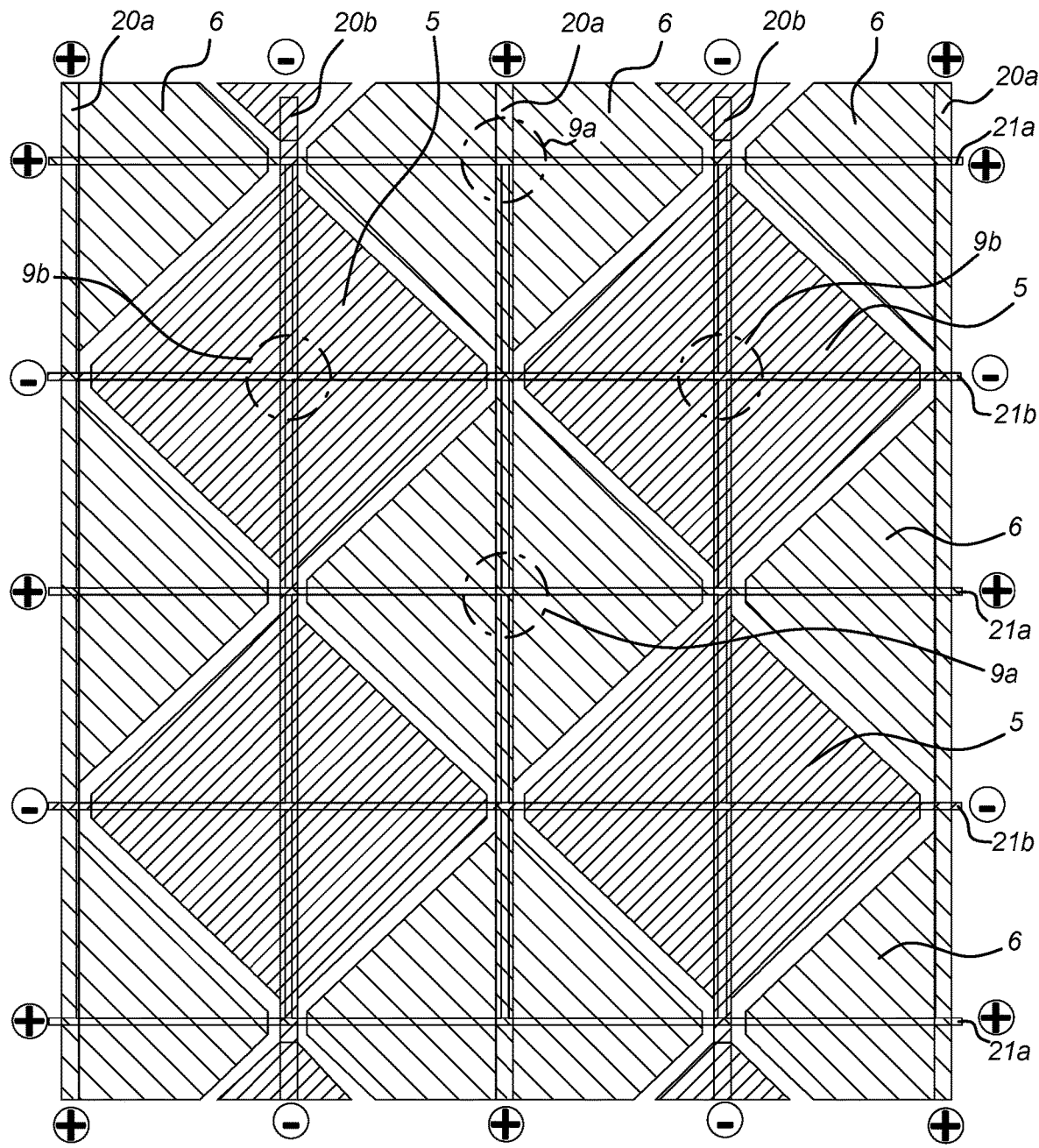
Figure 6:
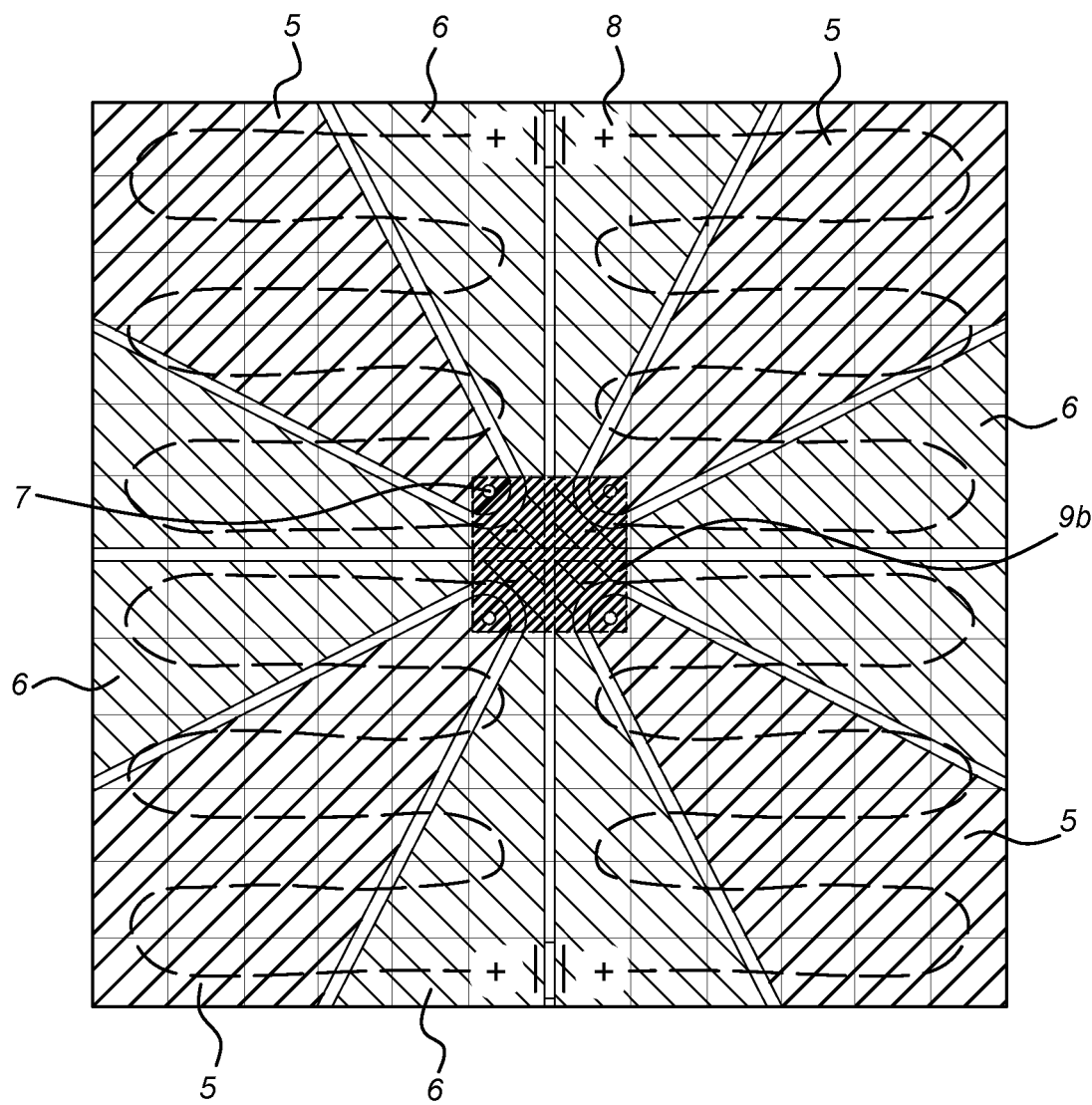
Figure 7A:
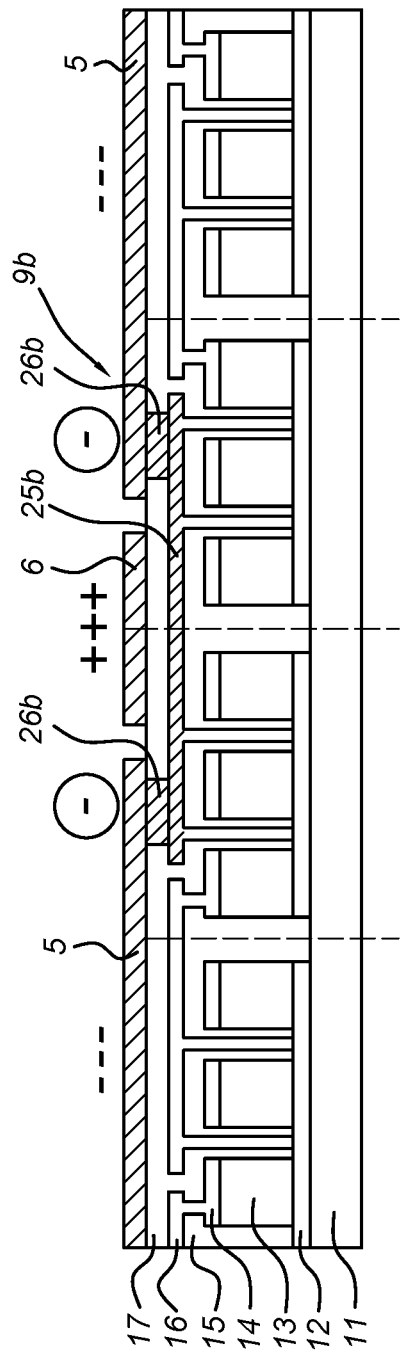
Figure 7B:
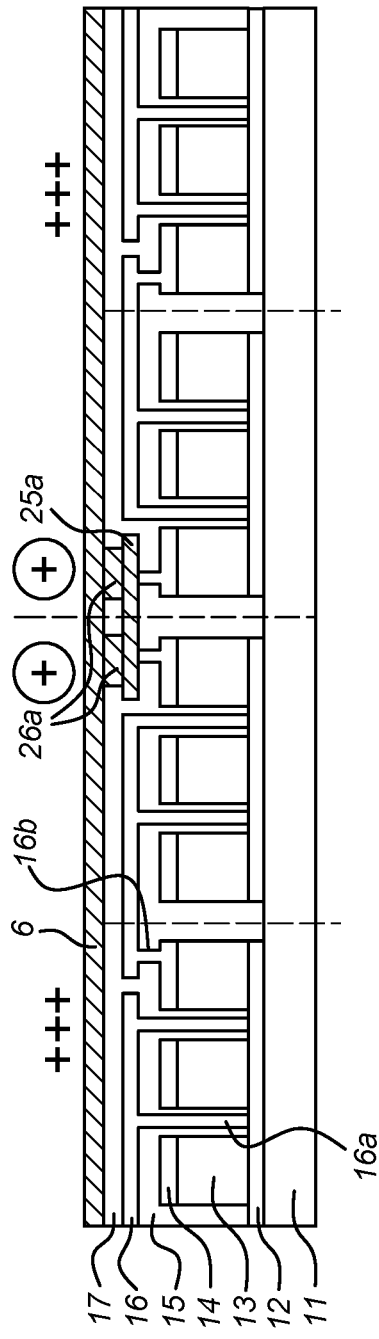
Figure 8:
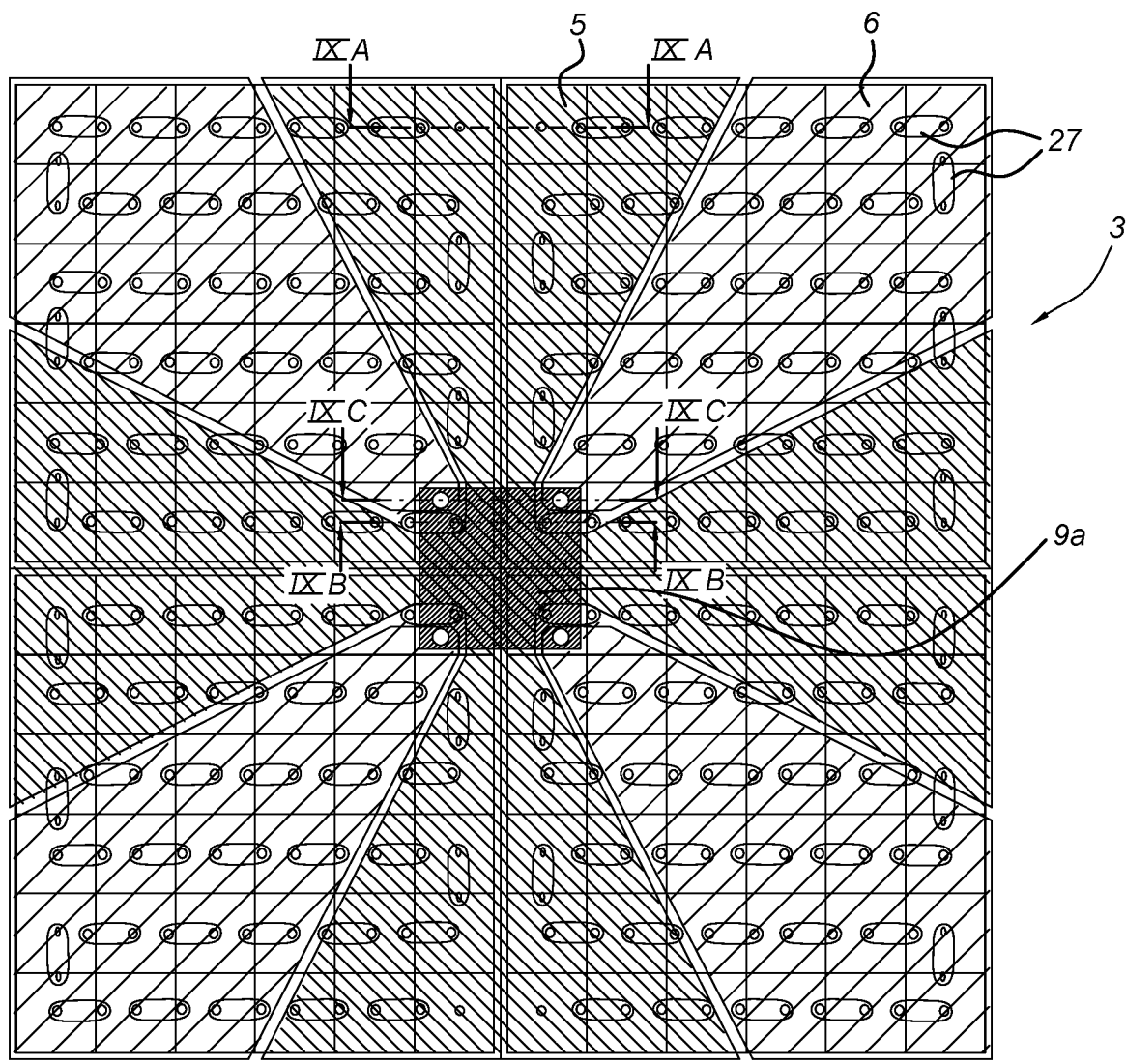
Figure 9A:
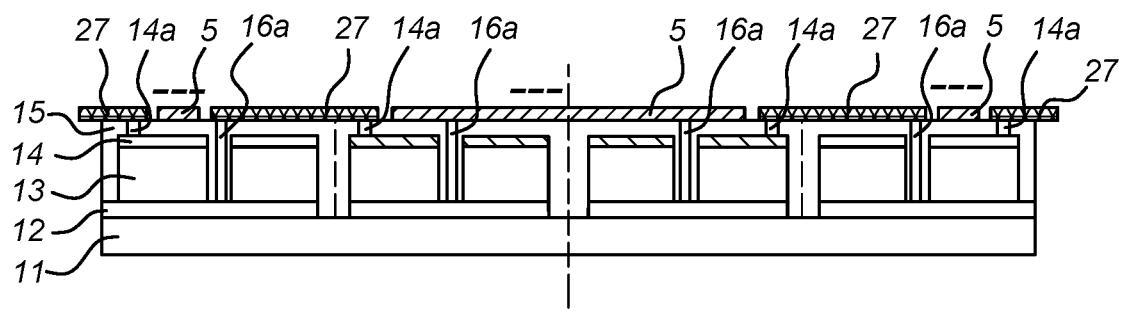
Figure 9B:
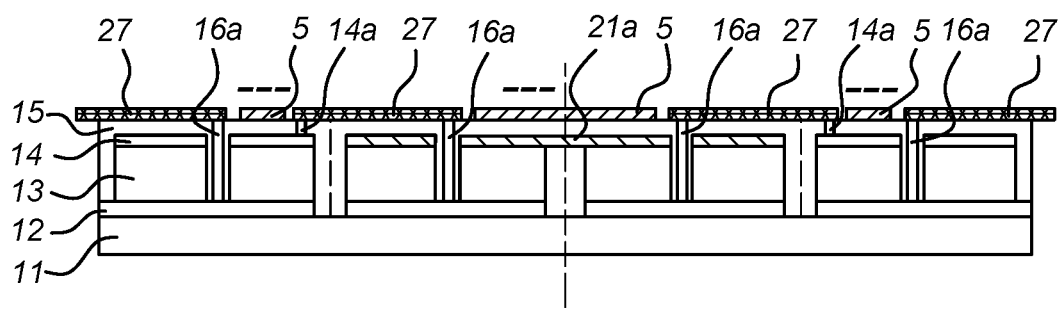
Figure 9C:
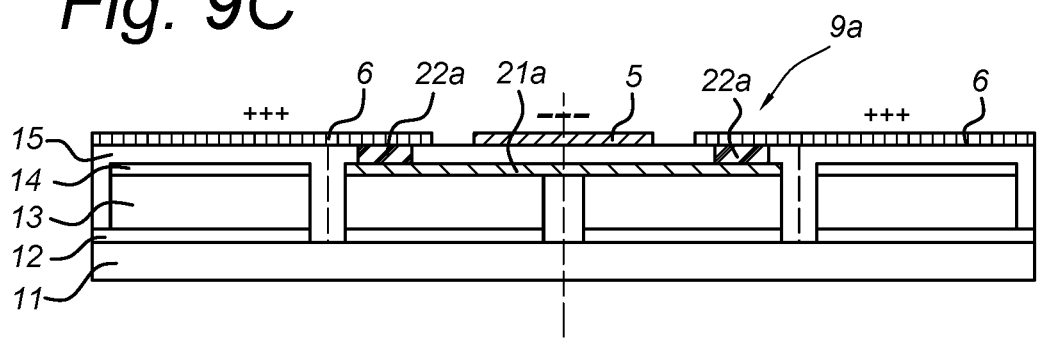
Figure 10A:
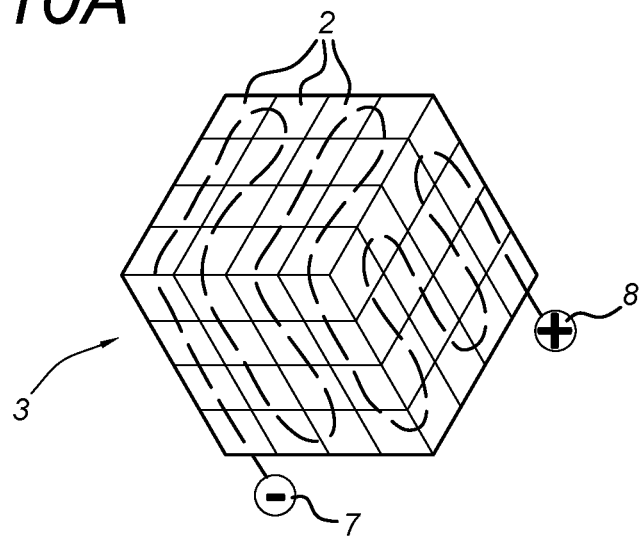
Figure 10B:
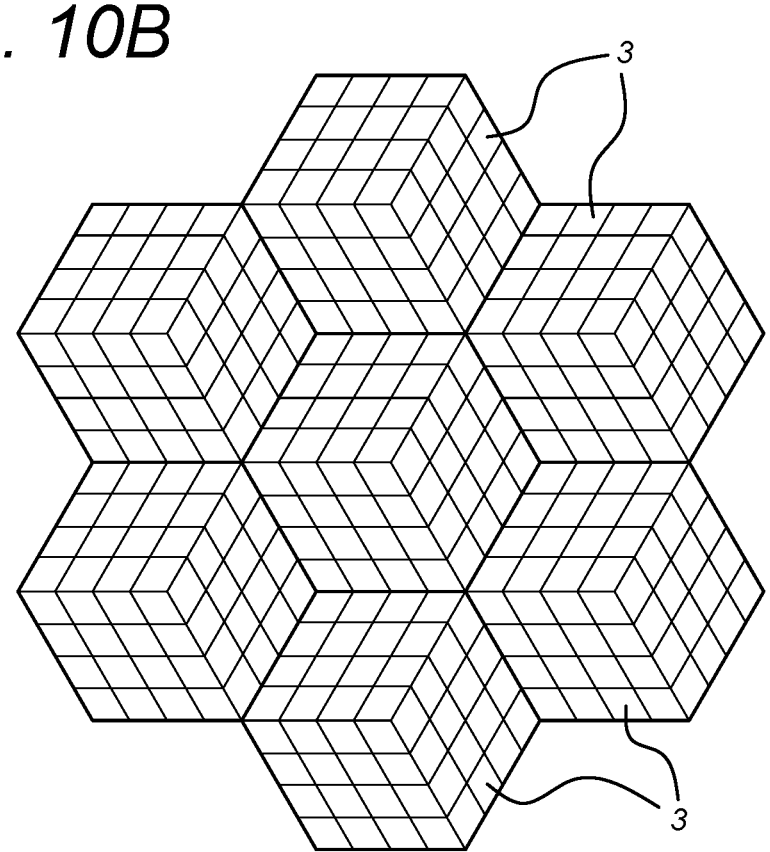

FIG. 4A-D show cross sectional views of the cross over connection members in the PV module of FIG. 3;

FIG. 5 shows a schematic view of an alternative embodiment of the PV module shown in FIG. 3;

FIG. 6 shows a schematic view of an even further embodiment of the present invention PV module;

FIGS. 7A and 7B show cross sectional views of the cross over connection members as applied in the embodiment of FIG. 6;

FIG. 8 shows a schematic view of a further embodiment of a PV cell unit for a PV module;

FIG. 9A-C show three cross sectional vies of the PV cell unit shown in FIG. 8; and FIGS. 10A and 10B show top views of a single PV cell unit, and a combination of PV cell units according to an even further embodiment of the present invention.

DESCRIPTION OF EMBODIMENTS

This invention relates to a photovoltaic (PV) module employing thin film PV cells 2. The PV module is e.g. build from a transparent substrate 11 on which a plurality of PV cell units 3 each comprising a plurality of PV cells 2 are manufactured. The PV cell units 3 may be interconnected (e.g. in a parallel circuit configuration) using an interconnecting or metallization layer of the PV module. The present invention embodiments provide an alternative interconnection design for such a PV module that makes it possible to cut the PV module into several pieces and retrieve several working pieces with same basic specifications (e.g. output voltage) as the original. Such PV modules are usually manufactured by making (patterned) layers of different materials, using an appropriate layering technique, such as deposition, printing, coating, etc. and further process techniques such as etching or mechanical processing, usually over the entire PV module surface.

The present invention embodiments provide an alternative interconnection design for such thin film based PV modules that makes it possible to cut the PV module into several pieces and retrieve several working pieces with same basic specifications (e.g. output voltage) as the original.

A prior art PV module is shown schematically in the view of FIG. 1A. This PV module 1 comprises a number of PV cell units 3, wherein each PV cell unit 3 has a plurality of photovoltaic cells 2 (the units 3 as shown have 9×9 PV cells 2) which are series connected in a string. Each PV cell unit 3 has one positive output terminal 8 and one negative output terminal 7, usually at the back side of the PV cell unit 3 (i.e. opposite the transparent substrate 2. The positive output terminals 8 of all PV cell units 3 are connected to a positive module terminal 1*a* via a positive connection part 6 (e.g. as shown using positive conductive fingers 6), and the negative output terminals 7 of all PV cell units 3 are connected to a negative module terminal 1*b* via negative connection part 5 (again, e.g. as shown using negative conductive fingers 5). The positive and negative connection parts 6, 5 form an interdigitated pattern. Note that the positive and negative conductive fingers 6, 5 may be arranged as wider current paths in a single layer of the thin film PV module 1, and may overlap the PV cell units 3 partly or completely.

A problem arises when the shape of the PV module 1 needs to be altered, e.g. by taking away three PV cell units 3 from the PV module 1 as e.g. indicated by lines 17 and 18 in FIG. 1A. Such a modification would sever the connection to the positive module terminal 1a of the entire top row of PV cell units 3, as well as of the bottom two rows of PV cell units 3. Either additional measures have to be taken to reconnect the affected PV cell units 3, or an entire new design of the interconnection features (negative and positive connection parts 5, 6) needs to be made and implemented, which both would be time and resource consuming.

The present invention embodiments may be implemented using a variety of thin film PV cells 2, of which FIGS. 1B and 1C show two examples. FIG. 1B shows a cross sectional view of a number of strip cell type PV cells 2, provided on a transparent substrate 11. On the transparent substrate 11, a transparent (negative) electrode 12 is positioned (e.g. indium tin oxide (ITO), on top of which a solar cell stack 13 is provided, which is the active material or combination of materials actually converting solar radiation in electrical energy (also called absorber layer). Layer wise a top electrode 14 is provided on top of the solar cell stack 13. Using appropriate techniques such as material deposition and etching, the transparent electrode 12 of one PV cell 2 is connected to the top electrode 14 of an adjacent cell 2. Finally an isolating top layer 15 is provided over the top electrode layer to finish the PV module. In these types of PV cells 2, the individual cell width Ws is e.g. limited to a maximum of 10 mm, e.g. less than 5 mm, so that charge carriers can be efficiently transported from the bottom part of the solar cell stack 13, and providing a sufficiently low internal resistance of the PV cell 2.

FIG. 1C shows an example of a more complex type of thin film PV cell 2, also called a metal wrap through (MWT) cell. MWT cells are primarily known in the field of silicon based mono- or polycrystalline wafer based cells, but are also applied in thin film PV cells. In this type of PV cell 2, a single transparent electrode 12 is provided in contact with multiple solar cell stacks 13 (which could be considered as PV sub-cells, the PV cell 2 then comprising a plurality of such PV sub-cells). The top of the same solar cell stacks 13 are contacted by a top electrode 14 layer. The single transparent electrode 12 is brought into a back side contact capability using vertical parts 16a which are isolated from the top electrode 14 layer. Adjacent ones of the MWT type PV cell 2 are in a series connection using the appropriate interconnecting member parts 16, 16a, 16b. Although an additional layer structure is needed as compared to the strip type PV cell of FIG. 1B, the multiple contacts to the front transparent electrode (vertical isolated parts 16a) allow to have a lower internal resistance and a more optimal current flow from the solar cell stacks 13. Also, this structure allows to combine a number of solar cell stacks 13 in parallel, providing a larger width $W_m$ (e.g. 20 mm, or more) of the combined MWT PV cell 2.

The present invention embodiments allow to have one or more PV cell units 3 of a PV module 1 to be taken out, thus allowing a free-form design of the PV module 1, without affecting proper operation of the PV module 1. To that end, the present invention provides a number of embodiments, which share the following features. The photovoltaic module 1 comprises a plurality of thin film photovoltaic cells 2 positioned on a transparent substrate 11, each thin film photovoltaic cell 2 comprising a transparent electrode 12 provided on the transparent substrate 11, a solar cell stack 13 positioned on the transparent electrode 12, and a top electrode 14 positioned on the solar cell stack 13. A plurality of parallel connected PV cell units 3 are provided, each comprising a string of series connected PV cells 2. The PV cells 2 may be any type of known thin film PV cell, e.g. a strip type of thin film solar cell, or a metal wrap through type of thin film solar cell. The photovoltaic module 1 further comprising a positive connection part 6, 20a and a negative connection part 5, 20b in a single top interconnection layer, providing the parallel connection circuit of the parallel connected PV cell units 3, and at least one cross over connection member 9a, 9b in a layer different from the single top interconnection layer. The at least one cross over connection member 21a, 22a; 22b, 23b; 25a, 25b provides an electrical connection in the negative connection part 5, 20b and/or in the positive connection part 6, 20a.

Figure 2:
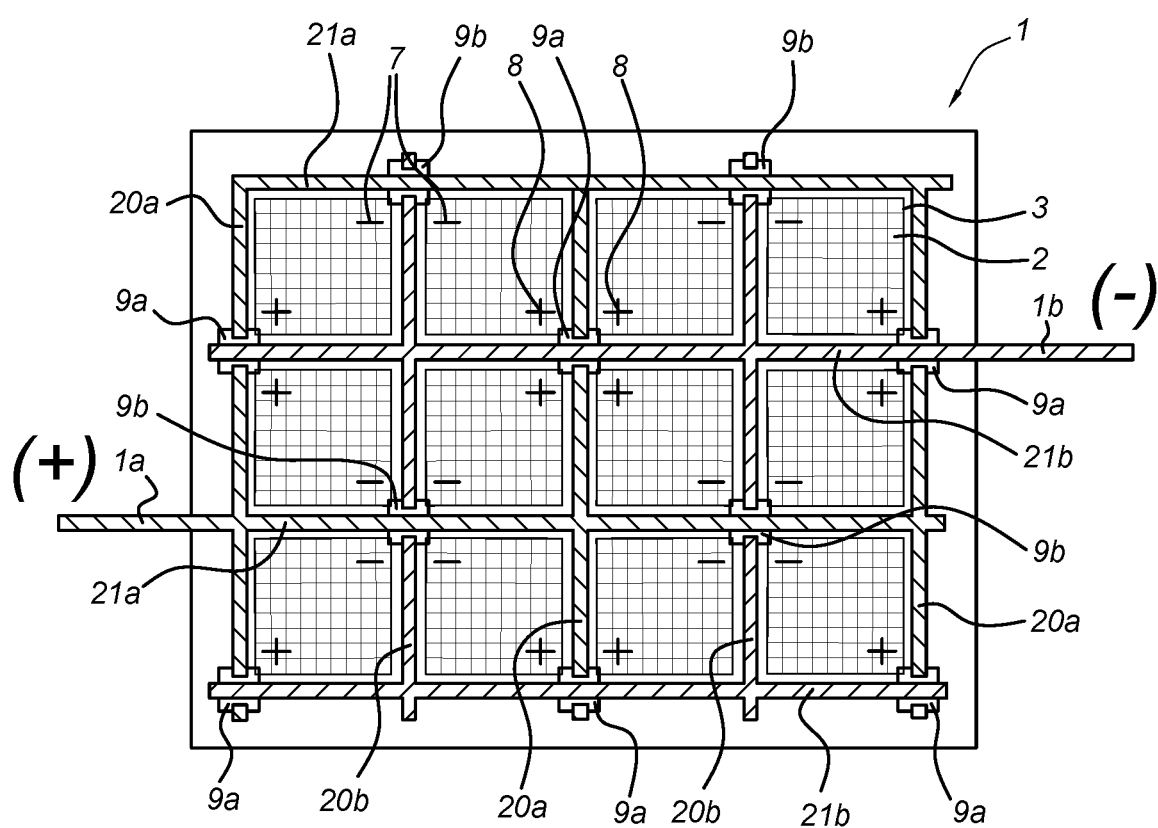
FIG. 2 shows a schematic view of a PV module with a number of cross over connection members according to a first embodiment of the present invention.

This generic embodiment is further described with reference to the schematic view of FIG. 2, showing a PV module 1 having a 4×3 configuration of PV cell units 3. FIG. 2 shows a view of a first practical embodiment of the present invention, wherein the positive connection part 6 is formed by a combination of vertical positive conductive lines 20a, horizontal positive conductive lines 21a, and positive contact bridges 9a (which are thus all electrically connected to a positive module terminal 1a). The negative connection part 5 is formed by a combination of vertical negative conductive lines 20b, horizontal negative conductive lines 21b, and negative contact bridges 9b (which are thus all electrically connected to the negative module terminal 1b). The PV cell units 3 are arranged in a pattern, such that the positive contact terminals 8 (and negative contact terminals 7) of each group of four adjacent PV cell units 3 are grouped together, allowing electrical connections to be made to the positive and negative contact bridges 9a, 9b, respectively. In this manner, an intermeshed pattern is formed of positive and negative grid lines which are mainly positioned in the single top interconnection layer: only the contact bridges 9a, 9b are in a different layer of the PV module 1. This ensures that even when a single PV cell unit 3 is removed from the PV module 1, connection to the remaining PV cell units 3 of the PV module 1 is maintained. There is no need whatsoever to redesign the cell connecting structure or to apply additional contact leads.

A schematic view of a PV module 1 according to a second embodiment of the present invention is shown in FIG. 3, the PV module comprising a plurality of strip shaped thin film PV cells 2 in a 4×4 array configuration of PV cell units 3. A cell width Ws of each of the plurality of PV cells 2 is less than 10 mm, e.g. less than 5 mm to keep the resistance of the transparent electrode layer 12 low enough in each series connected string of PV cells 2. The PV cell units 3 in this exemplary embodiment comprise e.g. 12 strip type PV cells 2 each having a dimension of 5×60 mm, providing a PV cell unit of 60×60 mm. In this case, each PV cell unit would be able to provide a 6V PV cell unit voltage. As shown in the embodiment of FIG. 3, the positive connection part 6 comprises a plurality of interconnected positive grid lines 20a, 21a with a first group of positive grid lines 20a provided in the single top interconnection layer, and a second group of positive grid lines 21a provided in the layer of the top electrodes 14. The positive grid lines 20a, 21a of the first group and the second group are oriented substantially perpendicular to each other. This embodiment would allow the positive connection part 6 to be limited to the surface area between PV cell units 3, which would e.g. allow light to enter the PV module from both sides. The embodiment may also be described as having a first group of grid lines 20*a* in the single top interconnection layer, and a second group of grid lines 21*a* in a buried layer of the PV module 1.

Similarly, in an additional or alternative embodiment, the negative connection part 5 comprises a plurality of interconnected negative grid lines 20*b*, 21*b* with a first group of negative grid lines 20*b* being provided in the single top interconnection layer, and a second group of negative grid lines 21*b* being provided in the layer of the top electrodes 14, and wherein the negative grid lines 20*b*, 21*b* of the first group and the second group are oriented substantially perpendicular to each other.

As shown in the embodiment depicted in FIG. 3, the at least one cross over connection member 9*a*, 9*b* is provided where the positive and negative grid lines 20*a*, 21*a*, 20*b*, 21*b* intersect. The implementation of the cross over connection members at any of four possible location in the grid are detailed in the cross sectional views of FIG. 4A-D as indicated in FIG. 3 by the lines IVA-IVA-IVD-IVD.

FIG. 4A-D also show that the type of PV cell 2 used in this embodiment is a strip cell type of PV cell 2. The series connected PV cells 2 are provided by means of conductive elements 14*a* between a transparent electrode 12 of a PV cell 2 and a top electrode 14 of an adjacent PV cell 2. This provides a low resistance path, and the conductive elements 14*a* can be easily produced using techniques known as such from semiconductor technologies.

Figure 4A:
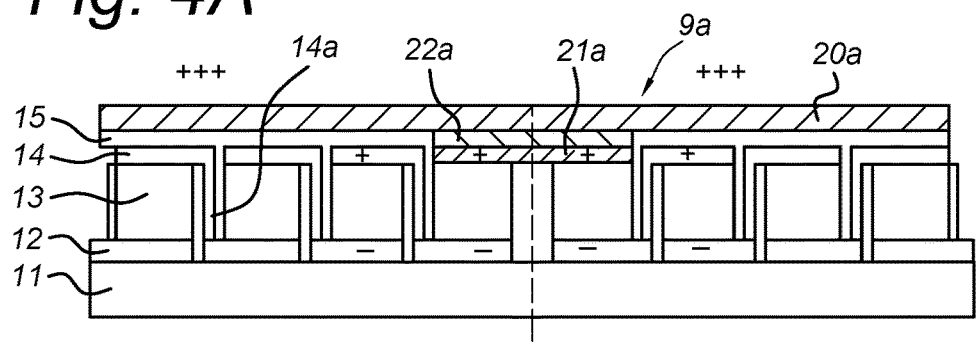
Figure 4B:
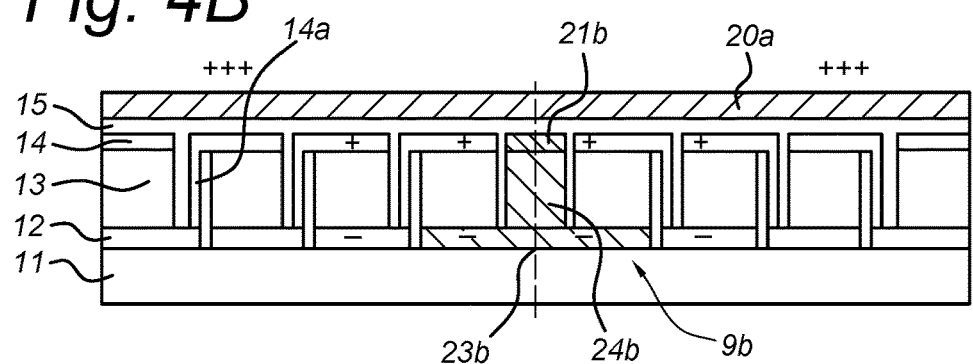
Figure 4C:
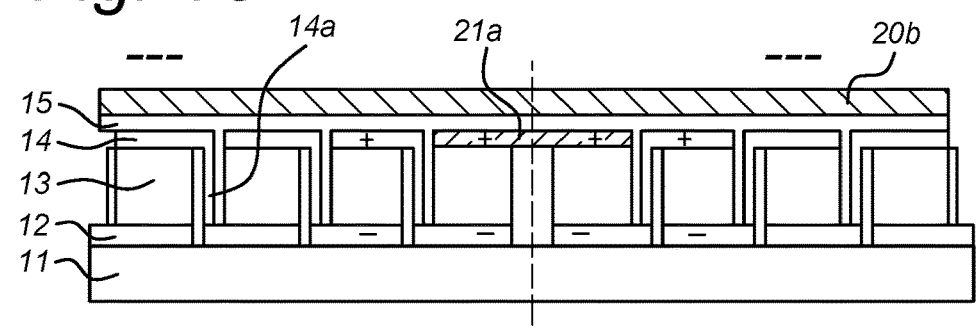

In the cross sectional views of FIGS. 4A and 4C, it is shown that the positive terminals of two adjacent PV cell units 3 can be connected in the layer of the top electrode 14. In the embodiments shown in FIGS. 4A and 4C, the at least one cross over connection member 9*a* for the positive connection part 6, 20*a* comprises a positive contact layer part 21*a* in the layer of the top electrodes 14, the positive contact layer part 21*a* connecting the top electrodes 14 of two adjacent ones of the PV cells 2 of two neighbouring PV cell units 3. The embodiment of FIG. 4A shows an implementation of the cross over connection member 9*a* where two positive grid lines 20*a*, 21*a* cross each other in the embodiment of the PV module 1 of FIG. 3. Here the at least one cross over connection member 9*a* for the positive part 6, 20*a* further comprises a connection layer 22*a* between the positive contact layer part 21*a* and the positive connection part 6, 20*a*. FIG. 4C shows the cross sectional view of the cross over connection member 9*a* where a negative grid line 20*b* of the first group crosses a positive grid line 21*a* of the second group.

Figure 4D:
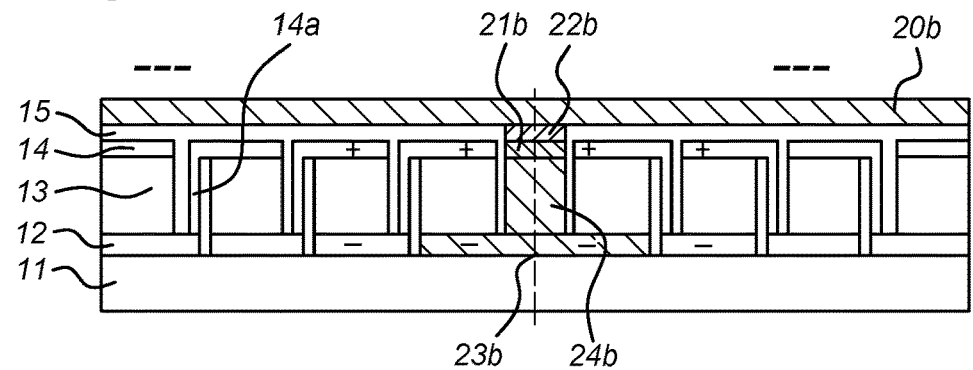

In the cross sectional views of FIGS. 4B and 4D, it is shown that the negative terminals of two adjacent PV cell units 3 can be connected in the layer of the transparent electrode 12. In these embodiments, the at least one cross over connection member 9*b* for the negative connection part 5, 20*b* comprises a negative contact layer part 23*b* in the layer of the transparent electrodes 12, the negative contact layer part 23*b* connecting the transparent electrodes 12 of two adjacent ones of the PV cells 2 of two neighbouring PV cell units 3, and a connecting stack 24*b*, 21*b* on top of the negative contact layer part 23*b*. This is an example of a 'buried' cross over connection member 9*b*, where at an intersection of a positive grid line 20*a* of the first group and a negative grid line 21*b* of the second group, the negative polarity transparent electrodes 12 of two adjacent PV cells are interconnected using the negative contact layer part 23*b*.

In an even further embodiment, shown in the cross section of FIG. 4D, the at least one cross over connection member 9*b* for the negative connection part 5, 20*b* further comprises a connection layer 22*b* between the connecting stack 24*b*, 21*b* and the negative connection part 5, 20*b*. This is an example of a cross over connection member 9*b* which extend all the way up to a negative grid line 20*b* of the first group.

FIG. 5 shows a schematic view of an alternative embodiment of the PV module shown in FIG. 3, wherein the negative and positive connection parts 5, 6 of the PV module overly the major part of the underlying PV cell units 3. In this embodiment, the positive connection part 6, 20*a* and the negative connection part 5, 20*b* in the single top interconnection layer span a surface area overlying the PV cell unit 3, i.e. a larger area than the grid line implementation as described for the embodiment shown in FIG. 3. As the connection parts 5, 6 have a larger surface area, it would be possible to make the associated layer thinner for a same current rating (which is more cost effective and saves time during manufacturing). In an even further embodiment, the surface area is provided with perforations, in order to make the PV module 1 (semi) transparent. It is noted that the positive and negative connection parts 5, 6 are shown as diamond shaped fields, but it will be apparent that other shapes and area distributions between the positive connection part 6 and negative connection part 5 may be envisaged.

In a further group of embodiments, the PV cells 2 of the PV module are implemented as thin film MWT PV cells 2. An exemplary embodiment is shown in the schematic view of FIG. 6 wherein the PV module 1 is a 2×2 array of PV cell units 3, each having an array of 6×6 series connected MWT type PV cells 2. In the embodiment shown, the orientation of the individual PV cell units 3 is such, that the negative terminals 7 of each PV cell unit 3 are adjacent to each other, allowing a single cross over connection member 9*b* to be used, which is underlying the positive connection part 6. FIGS. 7A and 7B show cross sectional views of the cross over connection members 9*a*, 9*b* variants which may be used in the MWT type of PV cell 2 embodiments.

In a first variant, as shown in the cross sectional view of FIG. 7A, and which may be applied in the embodiment as shown in FIG. 6, the PV cells 2 are of metal wrap through MWT thin film type. Each transparent electrode 12 and associated top electrode 14 of a PV cell 2 spans a plurality of PV sub-cells (see description of FIG. 1C above), and interconnecting members 16, 16*a*, 16*b* are provided for series connection of the PV cells 2 in a PV cell unit 3. The (negative) cross over connection member 9*b* comprises a negative parallel connection layer strip 25*b* for adjacent PV cell units 3 which is provided in a same layer as the interconnecting member 16. The negative parallel connection layer strip 25*b* is connected to the negative connection part 5 via an intermediate layer connection 26*b*. This configuration allows a parallel connection of a plurality of PV cell units 3 (more than the 2×2 configuration shown in FIG. 6) using a regular pattern of the positive and negative connections parts 5, 6, wherein the positive connection part 6 extends entirely in a single layer of the thin film PV module. Only negative cross over connection members 9*b* are then needed, one for each group of four PV cell units 3.

In an alternative embodiment, of which a cross sectional view is shown in FIG. 7B, the positive and negative parts are functionally interchanged. Hence, in this embodiment, the PV cells 2 are of metal wrap through (MWT) thin film type, wherein each transparent electrode 12 and associated top electrode 14 of a PV cell 2 spans a plurality of PV sub-cells, and interconnecting members 16, 16*a*, 16*b* are provided for series connection of the PV cells 2 in a PV cell unit 3. A positive parallel connection layer strip 25*a* for adjacent PV cell units 3 is provided in a same layer as the interconnecting member 16. The positive parallel connection layer strip 25*a* is connected to the positive connection part 6 via an intermediate layer connection 26*a*.

FIG. 8 shows a schematic view of a further present invention embodiment of a combination of four PV cell units 3 for use as a building block of a PV module 1. The PV cells 2 used in this embodiment are thin film metal wrap through type of PV cells 2. An entire PV module can e.g. comprise an array of 3×4 of the PV cell unit 3 combination of FIG. 8, resulting in a PV module having 48 PV cell units 3. In a connection layer of the (thin film) PV cell units, the PV cells 2 of the PV cell unit 3 are series connected using series connection areas 27. In the same layer the positive connection part 6 and negative connection part 5 are formed. As indicated in this schematic view, the combination of four PV cell units 3 further comprises a cross over connection member 9*a*, which electrically connects the four parts of the positive connection part 6 (but is positioned in a different layer). The negative and positive connection parts 5, 6 of a combination of four PV cell units 3 simply continue at their sides to the adjacent combinations of four PV cells 3.

This is shown more clearly with reference to the cross sectional views as shown in FIG. 9A-9C. The general structure of the thin film type MVT PV cells 2 is similar to the structure shown in the cross sectional drawings of FIG. 7A-D, with a few alternative arrangements. The thin film photovoltaic cells 2 are structured on a transparent substrate 11, each thin film photovoltaic cell 2 comprising a transparent electrode 12 provided on the transparent substrate 11, a solar cell stack 13 positioned on the transparent electrode 12, and a top electrode 14 positioned on the solar cell stack 13. An isolation top layer 15 is provided separating the top electrode 14 from the contact layer (with negative and positive connection parts 5, 6, and series connection areas 27). In this variant of the MWT type of PV cell 2, the transparent electrode 12 is electrically connected towards the top using interconnecting member 16*a*. The interconnecting member 16 is e.g. positioned in the centre part of the solar stack 13 (and electrically isolated therefrom, hence 'metal wrap through'). The interconnecting member 16*a* is either connected to an adjacent PV cell 2 using the series connection area 27 and a conductive element 14*a* to the top electrode 14 of that adjacent PV cell 2.

FIG. 9A shows the cross sectional view as indicated in FIG. 8 along the line 9A-9A, wherein negative terminals of adjacent MWT PV cells 2 are interconnected using the negative connection part 5. FIG. 9B shows the cross sectional view as indicated in FIG. 8 along the line 9B-9B, where the (positive) top electrodes 14 of the two adjacent PV cells 2 are interconnected in a buried structure using a positive contact layer part 21*a*. Note that at a corner position where four PV cells meet (position just below line 9B-9B in FIG. 8) four adjacent PV cells may be interconnected in this manner. FIG. 9C shows the cross sectional view as indicated in FIG. 8 along the line 9C-9C, wherein positive terminals of adjacent PV cells 2 are combined or interconnected with the positive contact layer part 21*a* and (additional) cross over connection members 22*a* (in the isolation top layer 15). In this embodiment, it is clear that the (buried) cross over connection member 9*a* is formed by the positive contact layer part 21*a* and cross over connection member 22*a*.

It is noted that a further variant of a PV module 1 would be possible, wherein the positive and negative structural elements are interchanged. The PV module 1 as described with reference to FIGS. 8 and 9A-9C uses only positive cross over connection members 9*a*. Variants are possible using only negative cross over connection members 9*b* (see e.g. embodiment described with reference to FIG. 6), or with a combination of positive and negative cross over connection members 9*a*, 9*b*.

The present invention embodiments have been described above using strip shaped PV cells 2 or rectangular shaped PV cells 2. It is however conceivable that other forms are used, which can be easily adopted in a manufacturing process for a thin film type PV module 1. E.g. the PV cells 2 may be shaped as rectangular cells, strip like cells, or as diamond shaped cells. Using diamond shaped cells, a further embodiment may be provided, wherein each PV cell unit 3 comprises three blocks of diamond shaped PV cells 2 having a major block axis, with the major block axis of one block being at 60 degrees to the major block axis of an adjacent block. This provides a PV module made up of hexagonal shaped PV cell unit blocks, which provides for a very good shading performance of the PV module 1. FIGS. 10A and 10B show such an exemplary embodiment. FIG. 10A shows a top view of a single PV cell unit 3, with a negative terminal 7 and positive terminal 8. The individual PV cells 2 of the three blocks are series connected as indicated by the meandering line from negative terminal 7 to positive terminal 8. FIG. 10B shows a top view of a combination of a plurality of PV cell units 3 thus forming a honeycomb shaped configuration of a PV module 1. Furthermore, as the present interconnection structures may be applied, it is possible to further amend the shape of the PV module with as little as possible effect on the performance of the PV module 1.

The present invention has been described above with reference to a number of exemplary embodiments as shown in the drawings. Modifications and alternative implementations of some parts or elements are possible, and are included in the scope of protection as defined in the appended claims.

The invention claimed is:

1. A photovoltaic module comprising a plurality of thin film photovoltaic cells positioned on a transparent substrate,
    wherein each of the plurality of thin film photovoltaic cells comprises a transparent electrode provided on the transparent substrate, a solar cell stack positioned on the transparent electrode, and a top electrode positioned on the solar cell stack,
    wherein a plurality of parallel connected photovoltaic cell units are provided, each photovoltaic cell unit comprising a portion of the plurality of thin film photovoltaic cells which are connected in series within the photovoltaic cell unit, the photovoltaic module further comprising a positive connection part and a negative connection part in a single top interconnection layer providing a parallel connection circuit of the plurality of the parallel connected photovoltaic cell units, wherein the positive connection part comprises a plurality of positive grid lines and wherein the negative connection part comprises a plurality of negative grid lines, wherein the plurality of positive grid lines and the plurality of negative grid lines form an intermeshed pattern in the single top interconnection layer, the plurality of positive grid lines and the plurality of negative grid lines being limited to a surface area in the single top interconnection layer between the plurality of the photovoltaic cell units, and
    at least one positive cross over connection member in a layer different from the single top interconnection layer configured to provide an electrical connection of positive polarity between two positive grid lines of the plurality of positive grid lines, wherein the two positive grid lines are positioned on opposite sides of a negative grid line of the plurality of negative grid lines and oriented substantially perpendicular to the negative grid line;

at least one negative cross over connection member in a layer different from the single top interconnection layer configured to provide an electrical connection of negative polarity between two negative grid lines of the plurality of negative grid lines, wherein the two negative grid lines are positioned on opposite sides of a positive grid line of the plurality of positive grid lines and oriented substantially perpendicular to the positive grid line;

wherein the at least one positive cross over connection member and the at least one negative cross over connection member comprise a contact layer part in a layer containing the top electrodes of the plurality of thin film photovoltaic cells, wherein the contact layer part connects the top electrode of a first thin film photovoltaic cell of a first photovoltaic cell unit with the top electrode of a second thin film photovoltaic cell of a second photovoltaic cell unit, wherein the first photovoltaic cell unit is adjacent to the second photovoltaic cell unit, and the at least one positive cross over connection member further comprises a connection layer between the positive contact layer part and the positive connection part.

2. The photovoltaic module according to claim 1, wherein a cell width of each of the plurality of thin film photovoltaic cells is less than 10 mm.

3. The photovoltaic module according to claim 1, wherein connections of the portion of the plurality of thin film photovoltaic cells which are connected in series are provided by means of conductive elements between a transparent electrode of a thin film photovoltaic cell of the portion of plurality of thin film photovoltaic cells and a top electrode of an adjacent photovoltaic cell of the portion of the plurality of thin film photovoltaic cells.

\* \* \* \* \*